(12) United States Patent
Keller

(10) Patent No.: US 6,838,677 B2
(45) Date of Patent: Jan. 4, 2005

(54) EXTRACTION AND DECELERATION OF LOW ENERGY BEAM WITH LOW BEAM DIVERGENCE

(75) Inventor: John H. Keller, Newburgh, NY (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 09/988,565

(22) Filed: Nov. 20, 2001

(65) Prior Publication Data

US 2002/0089288 A1 Jul. 11, 2002

Related U.S. Application Data

(63) Continuation-in-part of application No. 09/716,931, filed on Nov. 20, 2000, now abandoned.

(51) Int. Cl.[7] .............................. H01J 27/00; H01J 7/24
(52) U.S. Cl. .............................. 250/423 R; 250/492.22; 315/111.81
(58) Field of Search ........................ 250/423 R, 423 F, 250/492.22, 424, 427, 489, 492.21, 492.3, 492; 315/111.81, 111.91, 111.21, 111.31, 111.41, 111.61

(56) References Cited

U.S. PATENT DOCUMENTS

| | | | |
|---|---|---|---|
| 4,146,810 A | | 3/1979 | Hicks et al. .................. 313/11 |
| 4,870,284 A | * | 9/1989 | Hashimoto et al. ...... 250/423 R |
| 4,933,551 A | * | 6/1990 | Bernius et al. ............. 250/288 |
| 5,196,706 A | | 3/1993 | Keller et al. ............. 250/396 R |
| 5,365,070 A | * | 11/1994 | Anderson et al. ........ 250/423 R |
| 5,387,843 A | | 2/1995 | Nagayama et al. ...... 315/111.81 |
| 5,729,028 A | | 3/1998 | Rose ...................... 250/492.21 |
| 5,747,936 A | | 5/1998 | Harrison et al. ......... 315/111.81 |
| 5,748,360 A | | 5/1998 | Chikyou et al. ............. 359/298 |
| 5,780,862 A | | 7/1998 | Siess ....................... 250/492.3 |
| 5,932,882 A | | 8/1999 | England et al. ......... 250/492.21 |
| 5,969,366 A | | 10/1999 | England et al. ......... 250/492.21 |
| 6,040,582 A | | 3/2000 | Kim ...................... 250/492.21 |
| 6,326,631 B1 | | 12/2001 | Politiek et al. ......... 250/492.21 |
| 6,335,535 B1 | * | 1/2002 | Miyake et al. .......... 250/492.21 |

OTHER PUBLICATIONS

H. Ito et al, "Low Energy Beam Extraction in Terms of Magnetic Field, Electric Field and Ion Optics", IEEE, 1997, pp. 383–386.

* cited by examiner

Primary Examiner—Tuyet Thi Vo

(57) ABSTRACT

Ion optical methods and apparatus are provided for producing low energy ion beams. The apparatus includes an acceleration electrode for accelerating the ion beam, a deceleration electrode downstream of the acceleration electrode for decelerating the ion beam, and an ion optical element downstream of the deceleration electrode for inhibiting electrons in the beam plasma from reaching the deceleration electrode. The deceleration electrode is biased at a voltage that is selected to provide a potential barrier to thermal ions in the beam plasma to inhibit the thermal ions from reaching the acceleration electrode. The ion optical element maybe implemented as an electron repulsing electrode or as a magnetic element. The acceleration electrode, the deceleration electrode, or both, may be segmented in a direction lateral to the ion beam to define individually controllable electrode segments. The ion optical apparatus may be implemented as an ion source extraction system or as a deceleration lens system.

28 Claims, 11 Drawing Sheets

EXTRACTION AND DECELERATION OF LOW ENERGY BEAM WITH LOW BEAM DIVERGENCE

CROSS-REFERENCE OF RELATED APPLICATION

This application is a Continuation-in-Part of application Ser. No. 09/716,931, filed Nov. 20, 2000 now abandoned, which is hereby incorporated by reference.

FIELD OF THE INVENTION

This invention relates to ion beam systems such as ion implanters and, more particularly, to methods and apparatus for extraction and deceleration of low energy ion beams.

BACKGROUND OF THE INVENTION

A number of systems are known for ion beam processing of a workpiece. Among these, ion implantation has become a standard technique for introducing conductivity-altering impurities into semiconductor wafers. A desired impurity material is ionized in an ion source, the ions are accelerated to form an ion beam of prescribed energy and the ion beam is directed at the surface of the wafer. The energetic ions in the beam penetrate into the bulk of the semiconductor material and are embedded into the crystalline lattice of the semiconductor material to form a region of desired conductivity.

Ion implantation systems include an ion source for converting a gas or solid material into a well-defined ion beam. The ion beam is mass analyzed to eliminate undesired ion species, is accelerated and/or decelerated to a desired energy and is directed onto a target plane. The beam may be distributed over the target area by beam scanning, by target movement or by a combination of beam scanning and target movement.

A well-known trend in the semiconductor industry is toward smaller, higher speed devices. In particular, both the lateral dimensions and the depths of features in semiconductor devices are decreasing. State of the art semiconductor devices require junction depths less than 1,000 Angstroms and may eventually require junction depths on the order of 200 Angstroms or less.

The implanted depths of the dopant material is determined, at least in part, by the energy of the ions implanted into the semiconductor wafer. Shallow junctions are obtained with low implant energies. However, ion implanters are typically designed for efficient operation at relatively high implant energies, for example in the range of 20 keV to 400 keV, and may not function efficiently at the energies required for shallow junction implantation. At low implant energies, such as energies of 2 keV and lower, the ion beam expands as it is transported through the in implanter, and the beam current delivered to the wafer is much lower than desired. As a result, extremely long implant times are required to achieve a specified dose, and throughput is adversely affected. Such reduction in throughput increases fabrication costs and is unacceptable to semiconductor device manufacturers.

In an ion implanter, an ion beam is extracted from an ion source, is accelerated and/or decelerated to a desired energy and is delivered to a wafer. In extracting ion beams with a low final energy from the ion source, it is known that more ion current can be extracted if large acceleration and deceleration voltages are used. This tends to increase the virtual image size of the beam and to decrease beam divergence. Deceleration to the final energy may occur at one of several locations along the beamline. The location is selected to limit ion beam expansion and energy contamination.

In an electrode system for an ion source, the final electrode is preferably large compared to the acceleration electrode, as shown in FIGS. 5–9 of a paper by Hiroyuki Ito and Neil Bryan, "Low Energy Beam Extraction in Terms of Magnetic Field, Electric Field and Ion Optics," *IEEE* (1997), pages 383–386. However, experimental data shows that when the aperture of the deceleration or final electrode is larger than the acceleration electrode aperture, the acceleration electrode current becomes large, and operation becomes "glitchy," i.e., the extraction and deceleration gaps are prone to arcing. It is believed that the large current to the acceleration electrode is due to thermal ions from the beam plasma formed after the electrode system. The thermal ions are pulled from the beam plasma by the large fields on axis near the last deceleration electrode.

U.S. Pat. No. 5,196,706, issued Mar. 23, 1993 to Keller et al. discloses an extractor and deceleration lens for ion beam deposition apparatus. U.S. Pat. No. 5,932,882, issued Aug. 3, 1999 to England et al. and U.S. Pat. No. 5,969,366, issued Oct. 19, 1999 to England et al. disclose ion implanters with post mass selection deceleration. U.S. Pat. No. 5,747,936, issued May 5, 1998 to Harrison et al. discloses ion implantation apparatus with improved post mass selection deceleration.

All of the known prior art systems for producing low energy ion beams have had one or more disadvantages, including high electrode currents, glitchy operation and high beam divergence. Accordingly, there is a need for improved methods and apparatus for producing low energy ion beams.

SUMMARY OF THE INVENTION

In one aspect, the present invention provides apparatus and methods for producing low energy ion beams, which have low divergence and high beam current. The invention may be implemented as an ion source extraction system or as a deceleration lens system.

In another aspect, the present invention provides a low energy ion beam with low current to the acceleration electrode and in which extraction and deceleration are stable. This is accomplished by using a biased electrode to prevent ions in the beam plasma of the low energy beam from reaching the acceleration electrode and using an ion optical element for inhibiting electrons in the beam plasma from being pulled out of the beam plasma.

In one embodiment, the deceleration electrode is made at least slightly more positive than the beam plasma potential of the low energy ion beam, and an electron repulsing electrode is used to inhibit beam plasma electrons from reaching the deceleration electrode. The beam repulsing electrode is sufficiently negative to make the potential on the beam axis more negative than the beam plasma, thus inhibiting the electrons from reaching the deceleration electrode.

In another embodiment, the electron repulsing electrode is replaced by a magnetic element which produces a magnetic field for inhibiting electrons from reaching the deceleration electrode. In addition, the electric field on axis near the deceleration electrode can be made small by shaping of the deceleration electrode.

In other embodiments, the acceleration electrode, the deceleration electrode, or both may be segmented in a direction lateral to the ion beam, and selected voltages may be applied to respective electrode segments so that a more uniform beam density and focus may be obtained across the width of the beam.

According to an aspect of the invention, ion optical apparatus is provided for producing a low energy ion beam. The ion beam has a beam plasma at a final ion beam energy. The apparatus comprises an acceleration electrode for accelerating the ion beam, a deceleration electrode downstream of the acceleration electrode for decelerating the ion beam and an ion optical element downstream of the deceleration electrode for inhibiting electrons in the beam plasma from reaching the deceleration electrode. The deceleration electrode has a voltage that is selected to provide a potential barrier to thermal ions in the beam plasma to inhibit thermal ions from reaching the acceleration electrode. The deceleration electrode voltage is preferably selected such that the potential on the beam axis near the deceleration electrode is at least slightly positive with respect to the potential of the beam plasma.

In one embodiment, the ion optical element comprises an electron repulsing electrode having a voltage that is selected such that the potential on the beam axis near the electron repulsing electrode is at least slightly negative with respect to the potential of the beam plasma.

In another embodiment, the ion optical element comprises a magnetic element for producing a magnetic field for inhibiting electrons in the beam plasma from reaching the deceleration electrode.

Preferably, the aperture of the deceleration electrode is larger than the aperture of the acceleration electrode to permit low beam divergence.

According to another feature, the acceleration electrode, the deceleration electrode, or both, are segmented in a direction lateral to the ion beam to define individually controllable electrode segments. The segmented electrodes permit the beam density and focus of individual parts of the beam to be adjusted by controlling the voltages on the electrode segments.

According to another aspect of the invention, a method is provided for producing a low energy ion beam. The ion beam has a beam plasma at a final ion beam energy. The method comprises the steps of accelerating the ion beam with an acceleration electrode, decelerating the ion beam with a deceleration electrode downstream of the acceleration electrode, biasing the deceleration electrode at a voltage that is selected to provide a potential barrier to thermal ions in the beam plasma to inhibit thermal ions from reaching the acceleration electrode, and inhibiting electrons in the beam plasma from reaching the deceleration electrode with an ion optical element downstream of the deceleration electrode.

According to a further aspect of the invention, ion optical apparatus is provided for producing a low energy ion beam. The apparatus comprises an acceleration electrode for accelerating the ion beam and a deceleration electrode downstream of the acceleration electrode for decelerating the ion beam. The acceleration electrode, the deceleration electrode, or both, are segmented in a direction lateral to the ion beam to define individually controllable electrode segments.

BRIEF DESCRIPTION OF THE DRAWINGS

For a better understanding of the present invention, reference is made to the accompanying drawings, which are incorporated herein by reference and in which.

DETAILED DESCRIPTION

Figure 1A:
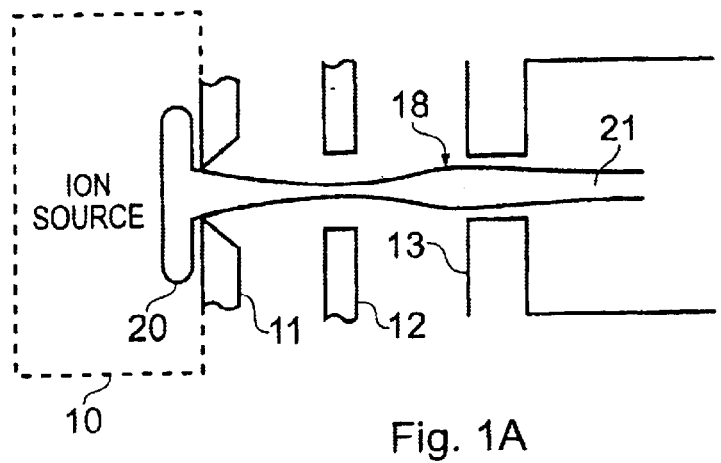
FIG. 1A is a schematic diagram of a prior art ion source extraction system.
Figure 1B:
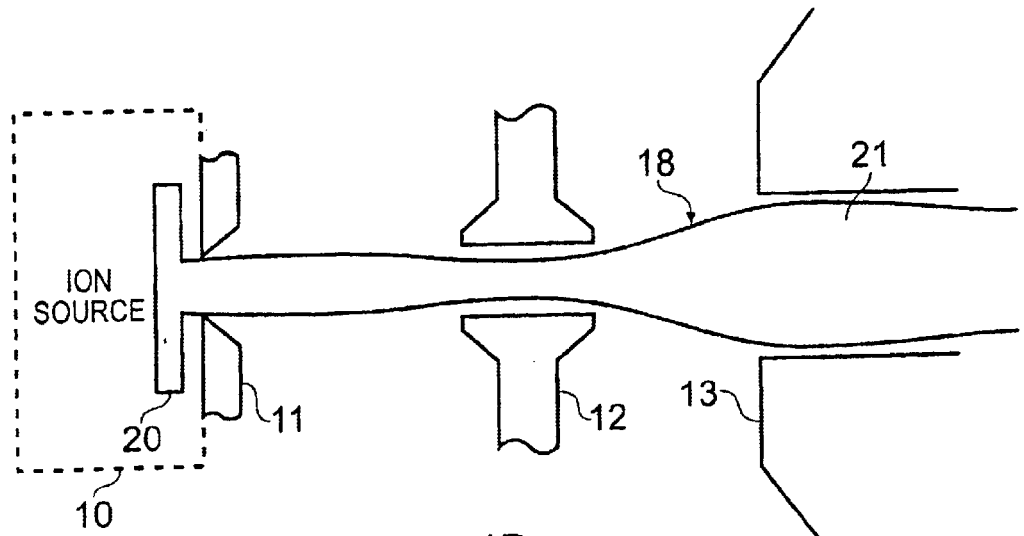
FIG. 1B is a schematic diagram of another prior art ion source extraction system.

FIGS. 1A and 1B are schematic diagrams of prior art extraction systems. The extraction system of FIG. 1A is similar to a low energy commercial high current ion implantation system, and the extraction system of FIG. 1B is shown in the aforementioned paper by Hiroyuki Ito et al. Like elements in FIGS. 1A and 1B have the same reference numerals. An ion beam 18 is extracted from an ion source 10. Each extraction system includes a first electrode 11, an acceleration electrode 12 and a deceleration electrode 13. A plasma 20 is also shown. The plasma consists of electrons and positive ions. Also shown is a final beam plasma 21, which includes the final ion beam plus electrons and thermal positive ions.

Figure 2:
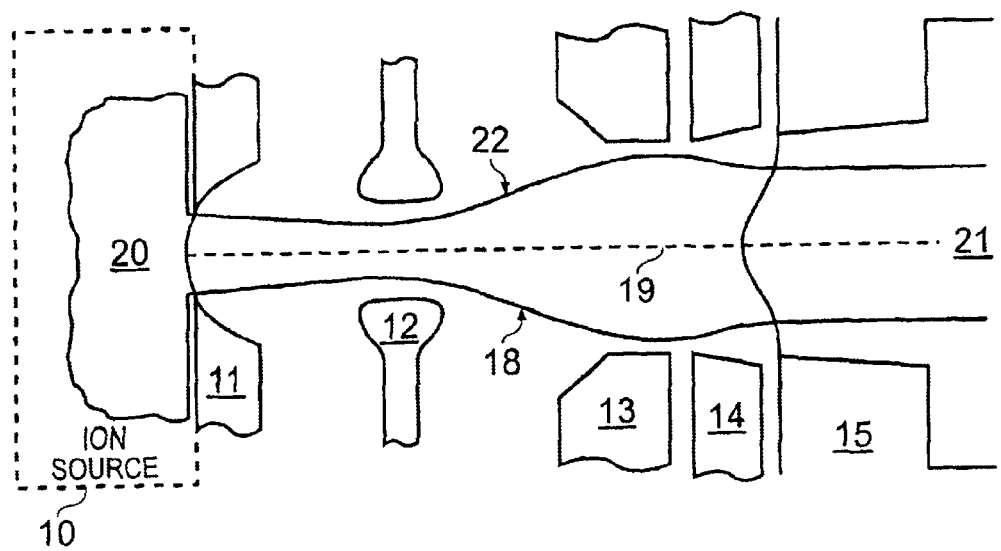
FIG. 2 is a schematic diagram of a first embodiment of an ion source extraction system in accordance with the invention.

FIG. 2 is a schematic diagram of a low energy ion optical system in accordance with an embodiment of the invention. Like elements in FIGS. 1A, 1B and 2 have the same reference numerals. The system includes first electrode 11, acceleration electrode 12, deceleration electrode 13, an electron repulsing electrode 14, and a final electrode 15. Plasma 20 is located in ion source 10. In embodiments described below where the ion optical system is implemented as a deceleration lens system, plasma 20 is replaced by a beam plasma which includes electrons, thermal ions and ion beam ions. The density of electrons and ions is such that the beam plasma 21 is nearly space charge neutral. Ion beam rays 22 show the general shape of the ion beam 18 in the ion optical system.

In this embodiment, electrons in beam plasma 21 are inhibited from reaching deceleration electrode 13 by electron repulsing electrode 14 being sufficiently negative so that the potential on beam axis 19 near electron repulsing electrode 14 is at least slightly more negative than the potential of beam plasma 21. In addition, thermal ions in beam plasma 21 are inhibited from reaching acceleration electrode 12 by deceleration electrode 13 being sufficiently positive so that the potential on beam axis 19 near deceleration electrode 13 is at least slightly more positive than the potential of beam plasma 21. Equivalently, deceleration electrode 13 can be viewed as preventing most of the thermal ions from reaching acceleration electrode 12 by curvature caused in the edge of beam plasma 21.

Because thermal ions in beam plasma 21 are inhibited from reaching acceleration electrode 12 by the potential on deceleration electrode 13, the aperture of deceleration electrode 13 may be larger than the aperture of acceleration electrode 12. Thus, a virtual ion image that is larger than in prior art ion extraction systems is formed, with the result that the divergence of the final low energy beam is reduced. At the same time, the current to acceleration electrode 12 from beam plasma 21 is greatly reduced, such that arcing of the ion optical system is also greatly reduced.

Figure 3:
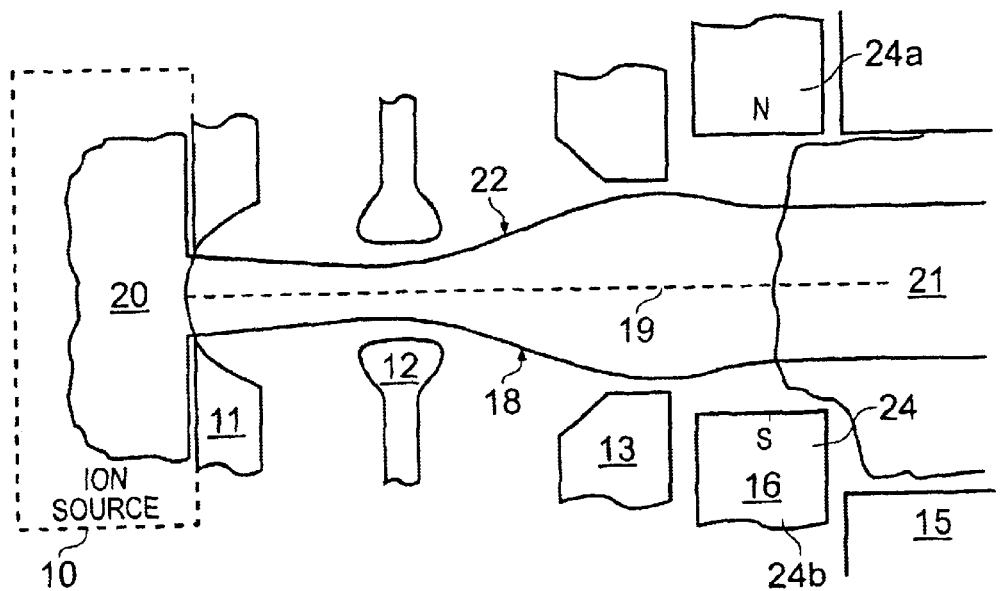
FIG. 3 is a schematic diagram of a second embodiment of an ion source extraction system in accordance with the invention.

FIG. 3 is a schematic diagram of an ion optical system in accordance with another embodiment of the invention. Like elements in FIGS. 1A, 1B, 2 and 3 have the same reference numerals. FIG. 3 is similar to FIG. 2, except that electron repulsing electrode 14 is replaced by a magnetic element 24 for inhibiting the electrons in beam plasma 21 from reaching deceleration electrode 13. The magnetic element 24 may include magnetic polepieces 24a and 24b of opposite magnetic polarities located on opposite sides of ion beam 18 such that ion beam 18 passes through a magnetic field. The magnetic field inhibits electrons in beam plasma 21 from reaching deceleration electrode 13.

In addition, the shape of deceleration electrode 13 can be selected to reduce the electric fields on beam axis 19 near deceleration electrode 13. In one embodiment, the aperture of deceleration electrode 13 is angled toward acceleration electrode 12, and its axial thickness is selected such that the electric fields on beam axis 19 are reduced. In particular, deceleration electrode 13 can be shaped such that the aperture size decreases in a downstream direction as shown in FIG. 3.

The ion optical systems of FIGS. 2 and 3 are described above in connection with extraction of ion beam 18 from ion source 10. However, the present invention is not limited to an ion source extraction system. In particular, ion optical systems similar to the ones shown in FIGS. 2 and 3 and described above may be utilized as an ion beam deceleration lens system at any suitable point along the beamline. In the case of a deceleration lens system, plasma 20 is a beam plasma upstream of the deceleration lens. In a deceleration lens system, a similar electrode configuration or electrode/magnetic element configuration may be utilized at the upstream end of the lens system so that the thermal ion current from the beam plasma to acceleration electrode 12 is reduced. Thus, the ion optical systems of the invention may be implemented as an ion source extraction system or a deceleration lens system.

Figure 4A:
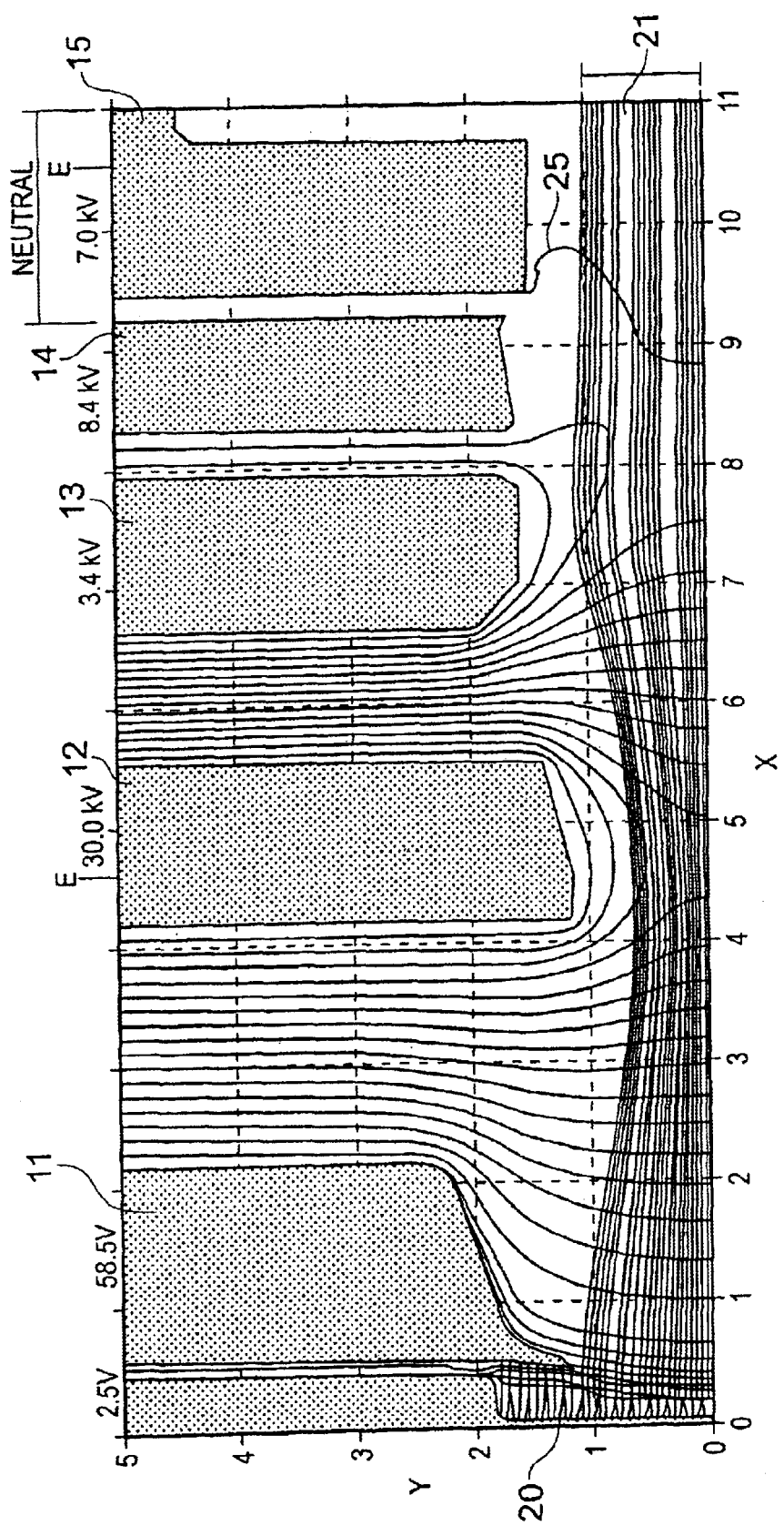
FIG. 4A is a simulation plot showing beam trajectories and equipotential lines for an embodiment of an extraction system in accordance with the invention.

FIG. 4A shows a two-dimensional simulation of the embodiment of FIG. 2 for producing a 7 keV high current boron ion beam. Such an ion beam can be used for injection into a mass analysis magnet in an ion implantation system. This simulation is optimized for a small divergence, which is desired for injection into the mass analysis magnet. The simulation includes the thermal divergence due to 1 eV ions typical of such high current ion sources.

The numbers at the top of FIG. 4A are the negative of the electrode voltages relative to the ion source plasma 20. In the simulation of FIG. 4A, first electrode 11 is set at −59.5 V, acceleration electrode 12 is set at −30.0 kV, deceleration electrode 13 is set at −3.4 kV, electron repulsing electrode 14 is set at −8.4 kV and final electrode 15 is set at −7.0 kV, all of which are specified relative to the potential of ion source plasma 20. It will be understood that these voltages can be shifted upwardly or downwardly relative to ground potential. Voltages selected to generate a 7.0 keV ion beam, with final electrode 15 at ground potential (0 kV), are shown in FIG. 4C. For this example, first electrode 11 is biased at +7.0 kV, acceleration electrode 12 is biased at −23 kV, deceleration electrode 13 is biased at +3.6 kV, electron repulsing electrode 14 is biased at −1.4 kV, and final electrode 15 is biased at ground. Corresponding beam energies are shown in FIG. 4D. In FIG. 4D, the dashed line represents beam energy as a function of distance (and electrode position) for the outside of the beam, and the solid line represents beam energy for the center (on axis) of the beam. As shown, the ion beam is accelerated to about 25 keV near acceleration electrode 12, is decelerated to about 6 keV near deceleration electrode 13, is accelerated to about 8 keV near electron repulsing electrode 14 and is decelerated to 7.0 keV near final electrode 15.

In the simulation of FIG. 4A, the voltage and size of deceleration electrode 13 are not sufficient to produce a voltage on axis 19 which is positive with respect to beam plasma 21. It is sufficient to reverse the curvature of meniscus 25 so that most of the thermal ions extracted from beam plasma 21 will go to electron repulsing electrode 14. The meniscus 25 represents the point along the beamline where the ion beam becomes substantially neutral. Thus, most of the thermal ions are prevented from going to acceleration electrode 12. Electron repulsing electrode 14 has a much smaller voltage with respect to the beam plasma 21 than acceleration electrode 12 (in this example, 1.4 kV versus 23 kV) and thus glitches (arcing) are prevented.

Figure 4B:
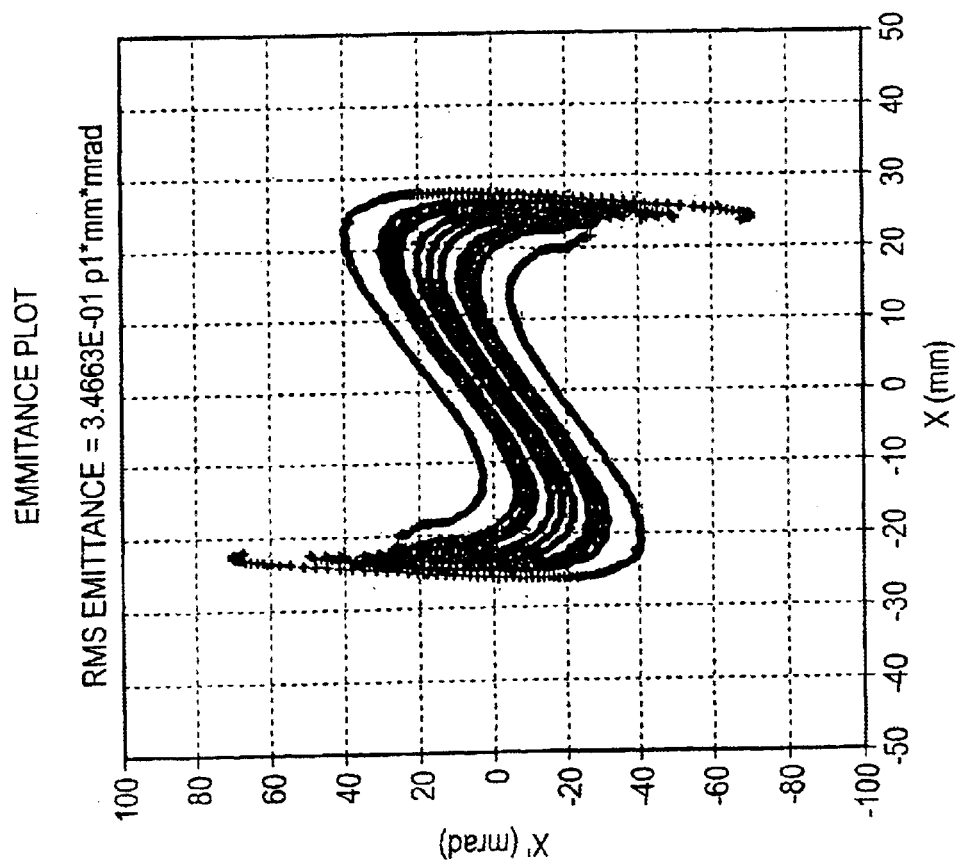
FIG. 4B is a phase plot of the ion beam shown in FIG. 4A.
Figure 4C:
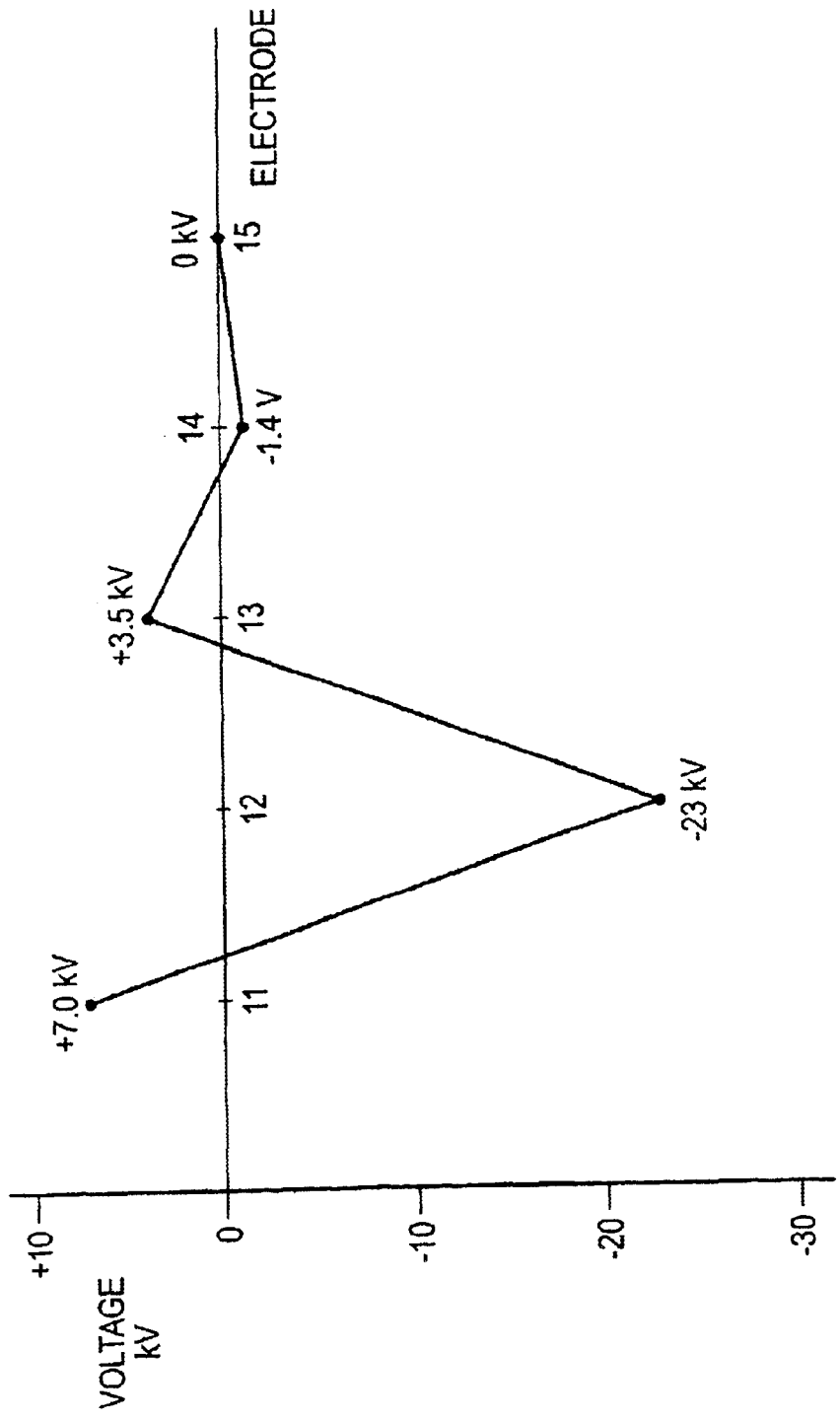
FIG. 4C is a voltage plot for the extraction system shown in FIG. 4A.
Figure 4D:
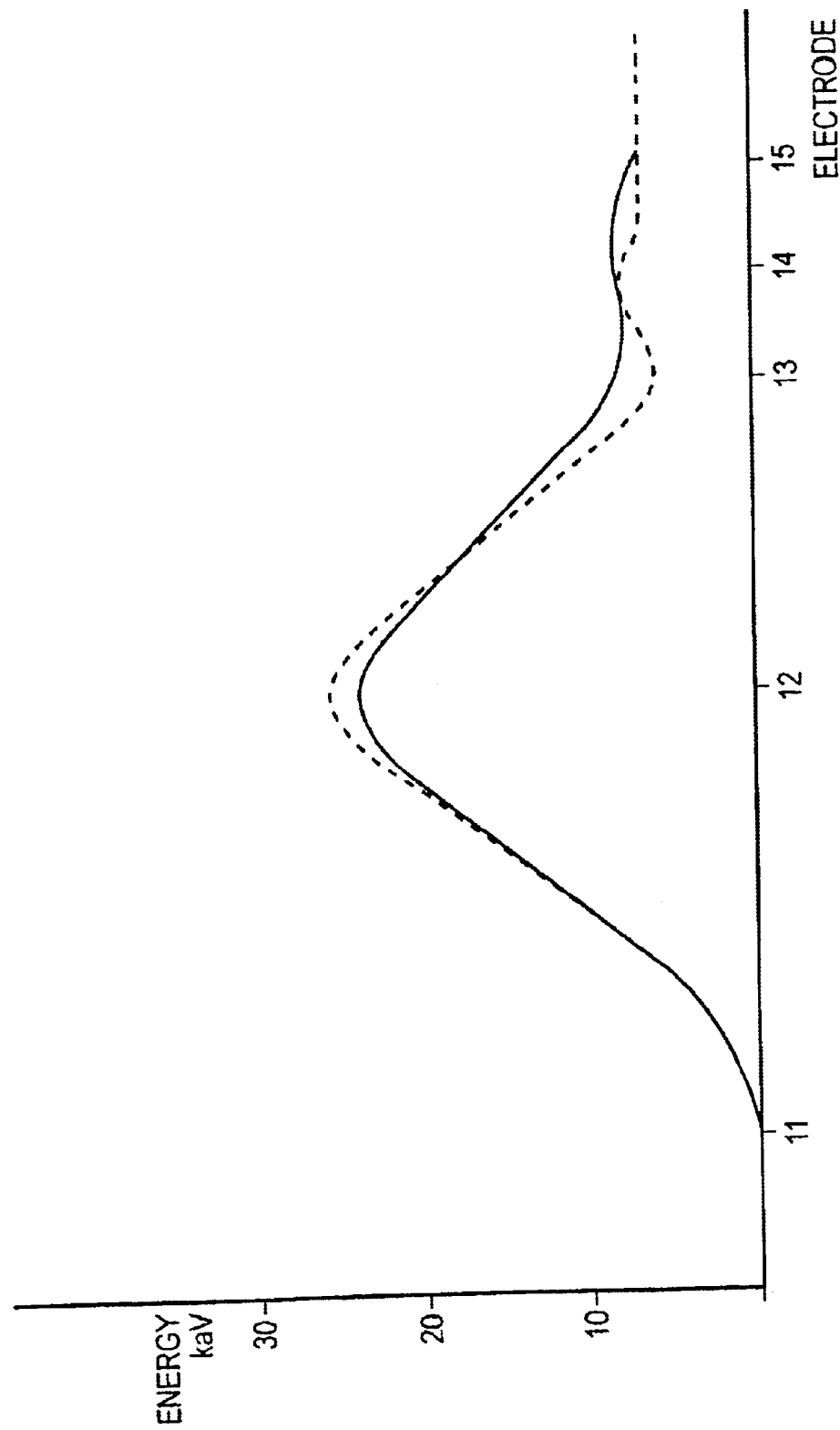
FIG. 4D is an energy plot of the ion beam shown in FIG. 4A.

FIG. 4B shows a phase plot of the ion beam in FIG. 4A. The ion beam has a maximum divergence of 40 milliradians, with most of the beam having a divergence considerably less than 40 milliradians. In the embodiment of FIG. 4A, the magnitudes of the voltages on deceleration electrode 13 and electron repulsing electrode 14 with respect to ground may be changed to achieve more or less divergence in the ion beam.

Figure 5A:
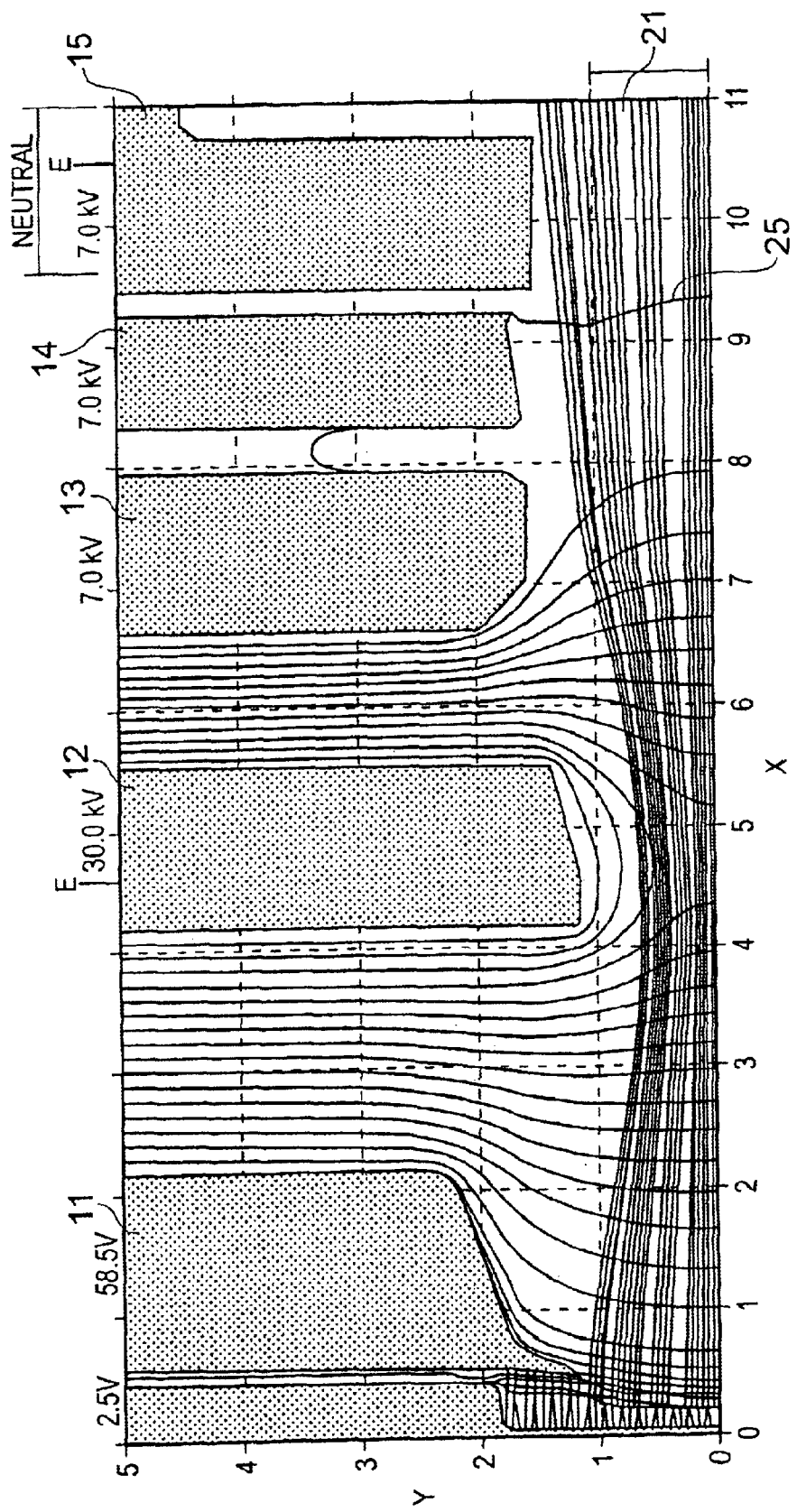
FIGS. 5A and 5B show equivalent simulation results for the extraction system of FIG. 4A, reconfigured in accordance with the prior art.
Figure 5B:
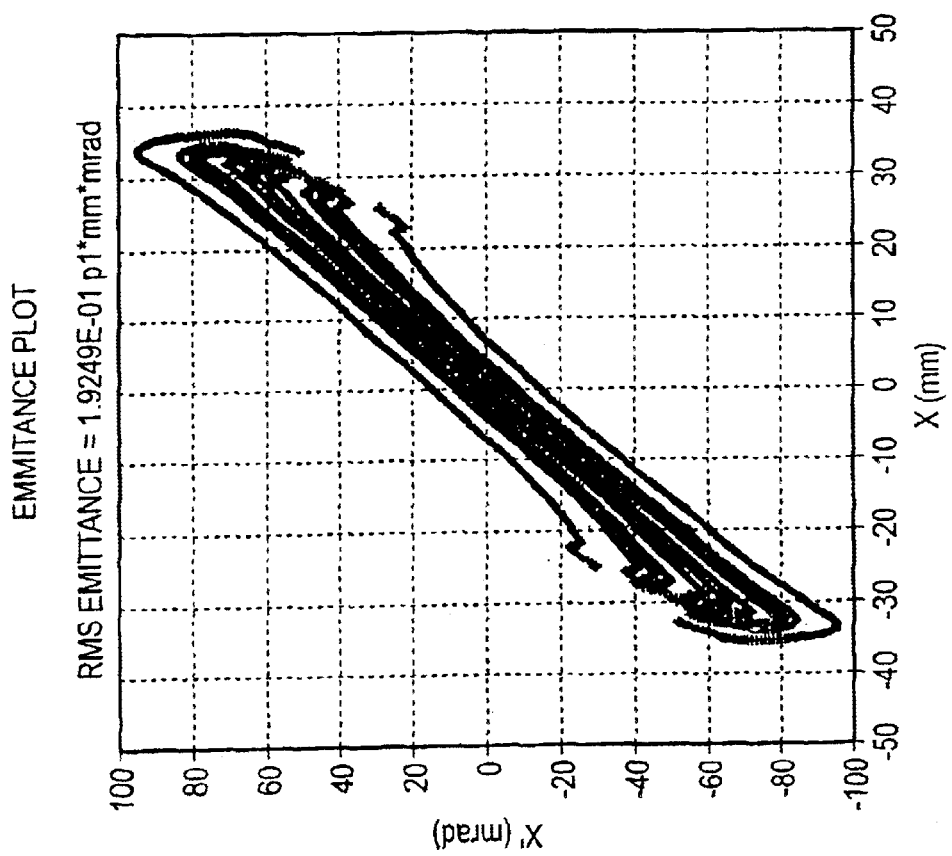

FIGS. 5A and 5B show the same ion optical system with deceleration electrode 13 and electron repulsing electrode 14 at the potential of the ion beam, thereby effectively reconfiguring the system to the prior art of FIGS. 1A or 1B. In particular, electrodes 13, 14 and 15 have equal bias voltages. This simulation shows a much more divergent beam than was obtained with the simulation of FIGS. 4A and 4B, with a maximum divergence of 100 milliradians, or 2.5 times as large as the simulation of FIGS. 4A and 4B. It should be noted that in this configuration of ground voltage on electrodes 13 and 14, even reducing the source slit size and reducing the source current does not recover the low divergence seen in the simulation of FIGS. 4A and 4B.

Figure 6A:
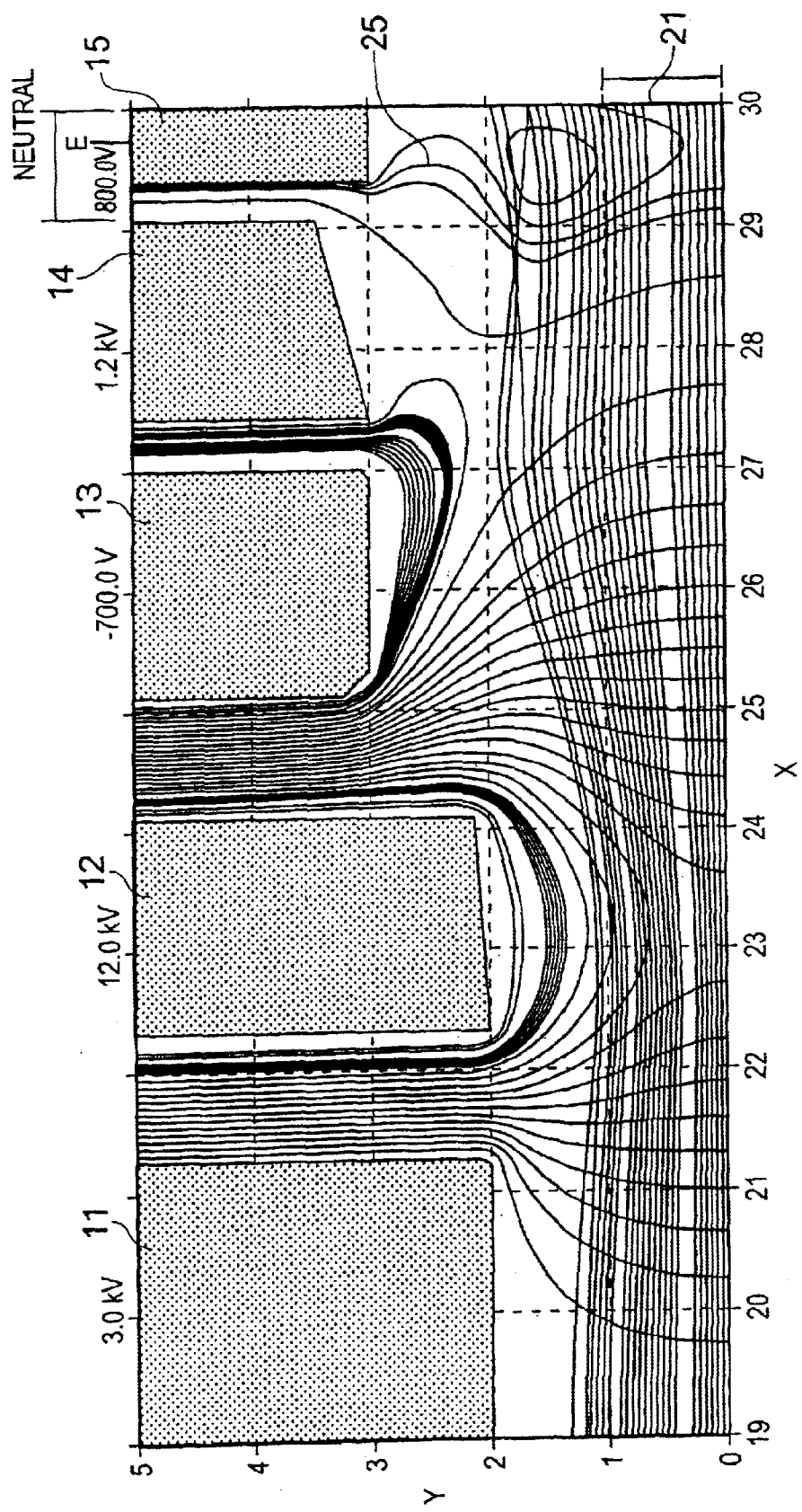
FIG. 6A is a simulation plot showing beam trajectories and equipotential lines for an embodiment of a deceleration lens in accordance with the invention.
Figure 6B:
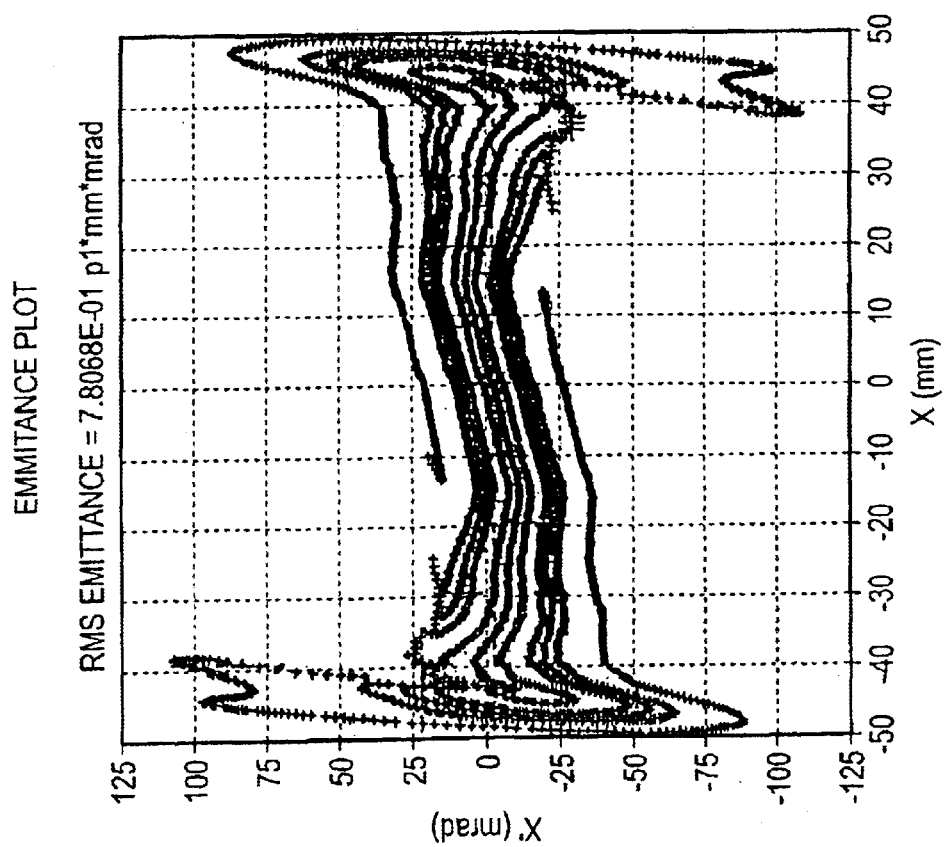
FIG. 6B is a phase plot of the ion beam shown in FIG. 6A.

FIGS. 6A and 6B show a two-dimensional simulation of a deceleration lens system in accordance with an embodiment of the invention. In this embodiment, the ion optical system of FIGS. 6A and 6B is located downstream of the ion source. As in the simulation of FIG. 4A, the numbers at the top of each electrode are the negative of the respective electrode voltages relative to the beam plasma. In the embodiment of FIG. 6A, first electrode 11 has a voltage of −3.0 kV, acceleration electrode 12 has a voltage of −12.0 kV, deceleration electrode 13 has a voltage of +700 V, electron repulsing electrode 14 has a voltage of −1.2 kV, and final electrode 15 has a voltage of −800 V, all of which are specified relative to the potential of the beam source.

An error in the neutralization routine of the simulation software on the right side produces an error in the meniscus 25 and also makes the "wings" in FIG. 6B larger. However, it can still be seen that low divergence is produced. The divergence is close to the thermal limit due to 1 eV ions in the ion source. The potential on deceleration electrode 13 and electron repulsing electrode 14 can be varied relative to the final beam ground potential to achieve the desired beam focus. Use of electrodes 13 and 14 also reduces the required voltage on acceleration electrode 12 for a given focus. For lower beam currents, or for parts of the beam with lower beam currents, the voltage on deceleration electrode 13 may be made negative (between the voltages of electrodes 12 and 14) to reduce focusing.

Figure 7:
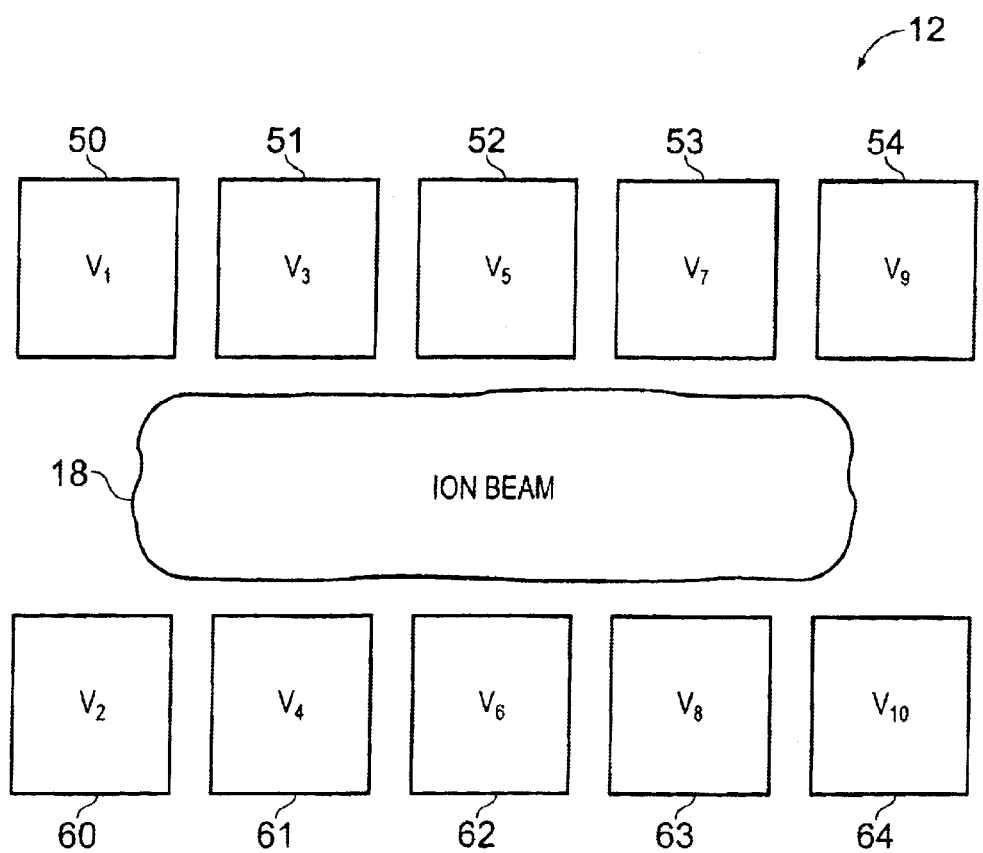
FIG. 7A shows an acceleration electrode that is segmented in a direction transverse to the ion beam.
FIG. 7B shows an deceleration electrode that is segmented in a direction transverse to the ion beam.

In the deceleration lens system shown in FIG. 6A and described above, acceleration electrode 12, deceleration electrode 13, or both, may be segmented in a direction transverse to the ion beam. An embodiment of a segmented acceleration electrode 12 is shown in FIG. 7 and an embodiment of a segmented deceleration electrode 13 is shown in FIG. 7B. The acceleration electrode 12 may include electrode segments 50, 51, 52, 53 and 54 above ion beam 18 and electrode segments 60, 61, 62, 63 and 64 located below ion beam 18 as shown in FIG. 7A and/or the deceleration electrode 13 may include electrode segments 50, 51, 52, 53 and 54 above ion beam 18 and electrode segments 60, 61, 62, 63 and 64 located below ion beam 18 as shown in FIG. 7B. The number and size of electrode segments may be selected for a particular application. Furthermore, independent voltages, some or all of which may be the same or different, may be applied to each of the electrode segments to achieve a desired result. Using the segmented electrodes, both the final beam density and the focus of individual parts of the beam may be adjusted. For example, if a given segment of acceleration electrode 12 has a more negative voltage than the two adjacent electrode segments, then the beam current density that passes that segment is increased and the focusing is increased. Likewise, if a given segment of deceleration electrode 13 has more positive voltage than the two adjacent electrode segments, then the beam current density that passes that segment is decreased and the focusing is increased. Thus, by adjusting the voltages on the segments, both the density and focus of the beam may be tailored. If the voltages on electrode 13 are all negative with respect to final ground, then electron repulsing electrode 14 may be eliminated. The positions of the electrode segments across ion beam 22 may be aligned or may be staggered.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Ion optical apparatus for producing a low energy ion beam, the ion beam having a beam plasma at a final ion beam energy, said apparatus comprising:

an acceleration electrode for accelerating the ion beam;

a deceleration electrode downstream of said acceleration electrode for decelerating the ion beam, said deceleration electrode having a voltage that is selected to provide a potential barrier to thermal ions in the beam plasma to inhibit thermal ions from reaching said acceleration electrode; and an ion optical element downstream of said deceleration electrode for inhibiting electrons in the beam plasma from reaching said deceleration electrode.

2. Ion optical apparatus as defined in claim 1 wherein the ion beam has a beam axis and wherein the deceleration electrode voltage is selected such that the potential on the beam axis near said deceleration electrode is at least slightly positive with respect to the potential of the beam plasma.

3. Ion optical apparatus as defined in claim 1 wherein said ion beam has a beam axis and wherein said ion optical element comprises an electron repulsing electrode having a voltage that is selected such that the potential on the beam axis near the electron repulsing electrode is at least slightly negative with respect to the potential of the beam plasma.

4. Ion optical apparatus as defined in claim 1 wherein said ion optical element comprises a magnetic element for producing a magnetic field.

5. Ion optical apparatus as defined in claim 4 wherein said deceleration electrode is shaped to limit on axis electric fields.

6. Ion optical apparatus as defined in claim 1 wherein the aperture of said deceleration electrode is larger than the aperture of said acceleration electrode.

7. Ion optical apparatus as defined in claim 1 wherein at least one of said acceleration electrode and said deceleration electrode is segmented in a direction lateral to the ion beam to define individually controllable electrode segments.

8. Ion optical apparatus as defined in claim 1, implemented as an ion source extraction system.

9. Ion optical apparatus as defined in claim 1, implemented as a deceleration lens system.

10. A method for producing a low energy ion beam, the ion beam having a beam plasma at a final ion beam energy, said method comprising the steps of:

accelerating the ion beam with an acceleration electrode;

decelerating the ion beam with a deceleration electrode downstream of the acceleration electrode;

biasing the deceleration electrode at a voltage that is selected to provide a potential barrier to thermal ions in the beam plasma to inhibit thermal ions from reaching the acceleration electrode; and inhibiting electrons in the beam plasma from reaching the deceleration electrode with an ion optical element downstream of the deceleration electrode.

11. A method as defined in claim 10 wherein the ion beam has a beam axis and wherein the step of biasing the deceleration electrode comprises selecting the deceleration electrode voltage such that the potential on the beam axis near the deceleration electrode is at least slightly positive with respect to the potential of the beam plasma.

12. A method as defined in claim 10 wherein the ion beam has a beam axis and wherein the step of inhibiting electrons in the beam plasma from reaching the deceleration electrode comprises selecting the electron repulsing electrode voltage such that the potential on the beam axis near the electron repulsing electrode is at least slightly negative with respect to the potential of the beam plasma.

13. A method as defined in claim 10 wherein the step of inhibiting electrons in the beam plasma from reaching the deceleration electrode comprises inhibiting electrons with a magnetic element which produces a magnetic field.

14. A method as defined in claim 13 further comprising the step of segmenting at least one of acceleration electrode and the deceleration electrode in a directional lateral to the ion beam.

15. A method as defined in claim 10 further comprising the step of segmenting at least one of the acceleration electrode and the deceleration electrode in a direction lateral to the ion beam.

16. Ion optical apparatus for producing a low energy ion beam, said apparatus comprising:

an acceleration electrode for accelerating the ion beam; and a deceleration electrode downstream of said acceleration electrode for decelerating the ion beam to form the low energy ion beam, at least one of said acceleration electrode and said deceleration electrode being segmented in a direction lateral to the ion beam to define individually controllable electrode segments, said electrode segments having independent voltage applied thereto for adjusting the density and focus of desired parts of the ion beam.

17. An ion extraction system or a deceleration lens system for producing low energy beams, said system comprising:

an acceleration electrode;

a deceleration electrode, the voltage between the acceleration electrode and the deceleration electrode being 5 keV or more; and a beam plasma formed at a final ion beam energy and comprising thermal positive ions and electrons, the deceleration electrode having a voltage more positive than the final beam energy to prevent most of the thermal positive ions in the said beam plasma from going to the said acceleration electrode, and the system further comprising means for preventing most of the electrons in the said beam plasma from going to the deceleration electrode.

18. The apparatus of claim 17, where the means for preventing most of the electrons in the said beam plasma from going to the deceleration electrode is an electron repulsing electrode downstream of the deceleration electrode.

19. The apparatus of claim 17, wherein the means for preventing the electrons from going to the deceleration electrode is magnetic.

20. The apparatus of claim 17, wherein the deceleration electrode is segmented in a longitudinal direction relative to the beam line, the segments thereof having different voltages applied thereto.

21. The apparatus of claim 17, wherein the acceleration electrode is segmented in a longitudinal direction relative to the beam line, the segments thereof having different voltages applied thereto.

22. An ion extraction system or a deceleration lens system for producing low energy beams, said system comprising:

an acceleration electrode;

a deceleration electrode, and a beam plasma formed at a final ion beam energy, wherein the acceleration electrode is segmented in a direction transverse to the beam line, the segments thereof having different voltages applied thereto.

23. An ion extraction system or a deceleration lens system for producing low energy beams, said system comprising:

an acceleration electrode;

a deceleration electrode, the voltage between the said acceleration electrode and the said deceleration electrode being 5 keV or more; and a beam plasma formed at a final ion beam energy, the deceleration electrode having a voltage which is positive relative to the acceleration electrode and the final beam energy, and the system further comprising an electron repulser downstream of the deceleration electrode, the electron repulser being either an electrode having a voltage which is negative relative to the deceleration electrode voltage and the final ion beam energy and positive relative to the acceleration electrode voltage; or a magnet providing a field configured to substantially prevent electrons in the ion beam from diversion to the deceleration electrode.

24. A method of increasing or varying the focal properties of a deceleration lens or extractor apparatus comprising an acceleration electrode, a deceleration electrode and a beam line, the method comprising varying the potential on the deceleration electrode transversely relative to the beam line to effect an increase or variance in the focal properties of said deceleration lens or extractor apparatus.

25. A method of obtaining a less divergent ion beam at the wafer of an ion implantation system, said method comprising passing the beam through a deceleration lens apparatus comprising an acceleration electrode and a deceleration electrode, wherein the acceleration and/or the deceleration potential on said electrode or electrodes is varied transversely with respect to the beam line to effect correction of beam divergence or density at said wafer.

26. An extraction or deceleration ion lens apparatus containing at least an acceleration electrode and a deceleration electrode, at least one of said acceleration and deceleration electrodes being segmented and having different voltages applied to said segments to provide better focal and density properties of the ion beam.

27. The apparatus of claim 26, where both the acceleration and deceleration electrodes are segmented.

28. The apparatus of claim 26, further comprising an electron repulsion electrode and a final beam plasma, and the electron repulsion electrode having a voltage sufficiently negative to substantially prevent electrons from being pulled out of the final beam plasma to the deceleration electrode.

* * * * *